United States Patent
Souza et al.

[11] Patent Number: 5,853,557
[45] Date of Patent: *Dec. 29, 1998

[54] LOW FRICTION, DUCTILE, MULTILAYER ELECTRODEPOSITS

[75] Inventors: Theresa R. Souza, Cranston; Allen E. Molvar, Barrington, both of R.I.

[73] Assignee: Handy & Harman, North Attleboro, Mass.

[*] Notice: The term of this patent shall not extend beyond the expiration date of Pat. No. 5,667,659.

[21] Appl. No.: 833,009

[22] Filed: Apr. 4, 1997

Related U.S. Application Data

[63] Continuation-in-part of Ser. No. 627,542, Apr. 4, 1996, Pat. No. 5,667,659.

[51] Int. Cl.[6] ............................................. C25D 15/00
[52] U.S. Cl. ..................... 205/109; 205/254; 205/263; 205/299; 205/302; 205/176; 205/184
[58] Field of Search ................................ 205/109, 254, 205/263, 299, 302, 170, 176, 184

[56] References Cited

U.S. PATENT DOCUMENTS

| | | | |
|---|---|---|---|
| 2,525,942 | 10/1950 | Proell ............................................. | 204/45 |
| 3,787,294 | 1/1974 | Kurosaki et al. ............................. | 204/16 |
| 4,098,654 | 7/1978 | Helle et al. ................................... | 204/16 |
| 4,312,772 | 1/1982 | Mori .............................................. | 252/12.2 |
| 4,529,667 | 7/1985 | Shiga et al. .................................. | 428/646 |
| 4,565,609 | 1/1986 | Nobel et al. ................................. | 204/44.4 |
| 4,599,149 | 7/1986 | Nobel et al. ................................. | 204/44.4 |
| 4,701,244 | 10/1987 | Nobel et al. ................................. | 204/44.4 |
| 4,880,507 | 11/1989 | Toben et al. ................................. | 204/44.4 |
| 4,994,155 | 2/1991 | Toben et al. ................................. | 204/28 |
| 5,028,492 | 7/1991 | Guenin ......................................... | 428/614 |
| 5,066,367 | 11/1991 | Nobel et al. ................................. | 204/44.4 |
| 5,141,702 | 8/1992 | Guenin et al. ............................... | 419/8 |
| 5,667,659 | 9/1997 | Souza et al. ................................. | 205/109 |
| 5,679,471 | 10/1997 | Cheng et al. ................................ | 428/673 |

OTHER PUBLICATIONS

X. Hu et al., "Zeta Potential & Codeposition of PTFE Particles Suspended in Electroless Nickel Solution", *Plating & Surface Finishing*, 51–53 (Mar. 1997).

Bapu, G.N.K. Ramesh et al., "Electrodeposition of Nickel–Polytetrafluoroethylene (PTFE) Polymer Composites," *Plating & Surface Finishing*, 86–88 (Apr. 1995).

Bhalla, V. et al., "Friction and Wear Characteristics of Electrodeposited Copper Composites," *Plating & Surface Finishing*, 58–61 (Nov. 1995).

Primary Examiner—Kathryn L. Gorgos
Assistant Examiner—Kishor Mayekar
Attorney, Agent, or Firm—Pennie & Edmonds LLP

[57] ABSTRACT

The present invention relates to composite articles including a surface layer of tin, lead, silver or an alloy thereof that contains co-deposited non-ionic polymeric particles to provide a reduced-friction deposit that has an initially low coefficient of friction and low insertion force and fretting corrosion in separable electronic connectors, and to methods for preparing the plated articles. The polymeric particles have a size between about 0.1 to 0.45 μm in diameter to reduce the coefficient of friction of the resultant deposit to about 0.45 or below. Also, the deposit has excellent electrical properties and can be successfully soldered. The invention also relates to a solution for plating the surface layer of the composite articles, which surface layer reduces insertion force and fretting corrosion of separable electronic connectors.

14 Claims, 1 Drawing Sheet

LOW FRICTION, DUCTILE, MULTILAYER ELECTRODEPOSITS

CROSS-REFERENCE TO RELATED APPLICATIONS

This application is a continuation-in-part of U.S. patent application Ser. No. 08/627,542, filed Apr. 4,1996, now U.S. Pat. No. 5,667,659.

FIELD OF THE INVENTION

The present invention relates to a deposit of a multi-layer ductile metal matrix on a substrate, where the deposit is preferably produced by electroplating. The ductile metal matrix deposit includes a surface layer of tin, lead, silver or an alloy thereof that contains a co-deposit of polymeric particles of polytetrafluoroethylene ("PTFE") or other non-ionic fluorocarbon resins to provide an initial, relatively low coefficient of friction to the deposit, but which is capable of being removed to expose portions of the article having a relatively higher coefficient of friction. The invention also relates to a solution for plating the surface layer of the composite articles, which surface layer reduces insertion force and fretting corrosion of separable electronic connectors.

BACKGROUND OF THE INVENTION

Conventional substrates useful in electrical applications, such as copper or iron containing alloys, including copper, brass, bronze, steel, stainless steel and the like, and of any useful thicknesses of ductile metal coatings for such applications, typically have a high coefficient of friction on the order of at least 0.6. The substrate material is relatively harder than the ductile matrix, which is subsequently applied. A coating of tin, lead, silver or one of their alloys is typically plated directly on the substrate to enhance a variety of properties of the electrical components.

The traditional method for plating tin-lead alloys, commonly called Solder Plate, is to have these two metals present in solution as fluoborates with an excess of fluoboric acid and boric acid. It is common to add various types of proteins, such as peptones, glue, gelatin, or meat proteins to obtain smoother deposits. The fluoborate-based bath containing peptone is most commonly used and is commercially successful in obtaining smooth matte deposits. Brighter tin-lead solder deposits can be obtained from these fluoborate-based baths by adding various brightening agents, such as aromatic alkane pyridine compounds, ethylene oxide wetting agents and formaldehyde.

Alkane or alkyl sulfonic acids containing 1 to 5 carbon atoms have also been used in electroplating solutions. One early example is U.S. Pat. No. 2,525,942 to Proell. Several more recent patents describe the use of various additives to improve the brightness of deposits, the useful current density ranges, and/or the solderability of the deposits and to improve the performance of the electroplating bath. Examples are U.S. Pat. Nos. 4,565,609, 4,701,244, and 5,066,367, all to Nobel et al.

Low-friction coatings have been suggested for use in electronic connectors. For example, an article by G.N.K. Ramesh Bapu, et al. ("Bapu"), entitled "Electrodeposition of Nickel-Polytetrafluoroethylene (PTFE) Polymer Composites," discloses use of a nickel-PTFE composite. The Bapu composites were obtained using a Watts nickel bath containing 25 ml/L PTFE suspension. The volume percent of PTFE in the composite increased with PTFE concentration in the bath and the current density, and resulted in an adherent, smooth, uniform and semi-bright deposit when the bath was operated at 6.0 A/dm$^2$ at a pH of 3 and a temperature of 50° C.

An article by V. Bhalla et al. ("Bhalla"), entitled "Friction and Wear Characteristics of Electrodeposited Copper Composites," discloses low friction where PTFE particles are dispersoids in copper composite coatings. Bhalla found that, although the Cu-PTFE composite showed the lowest wear index, at best the Cu-PTFE had a higher coefficient of friction than copper-graphite when deposited at 2 A/dm$^2$ and 30° C. This reference concludes that a copper-graphite composite was the best self-lubricating coating of those tested.

An article by X. Hu et al. ("Hu"), entitled "Zeta Potential & Codeposition of PTFE Particles Suspended in Electroless Nickel Solution," discloses that the Zeta potential of PTFE particles is more positive than the effects of other surfactants on dispersion and that PTFE particles are easier to codeposit with Ni-P to produce composite films having a low coefficient of friction.

However, conventional tin, lead, and tin-lead alloys are a favored electrofinish for corrosion protection of electronic connectors, including the crimp and contact portions of the connectors. The main problem with these conventional electroplating materials is that the coefficient of friction for tin, lead, silver and their alloys is typically greater than 0.6.

In an attempt to reduce friction in a bearing surface, U.S. Pat. No. 4,312,772 discloses a porous metal or alloy layer formed by sintering on a metal backing of steel, for example. The porous or alloy layer is generally copper or a copper-base alloy, which is impregnated with a mixture of 1 to 25 percent by volume of lead fluoride, 1 to 30 percent by volume of lead, and a lead or lead-tin alloy having 3 to 30 percent by weight of tin, the balance of lead, and the remainder being PTFE, where the total amount of lead fluoride and lead, lead-tin alloy or mixture thereof is between about 2 to 35 percent by volume in total. This article has poor electrical characteristics due to the high amount of PTFE, and is not used when electrical connectors are desired.

U.S. Pat. No. 4,098,654 discloses electroplating baths of codeposited polyfluorocarbon resin particles and metals to form coating layers, where the positively charged fluorocarbon particles having a size of less than about 10 $\mu$m are kept dispersed in the baths in the presence of both a cationic and non-ionic fluorocarbon surfactant.

The high coefficient of friction in conventional tin, lead, silver, or their alloys results in a high insertion force required to connect separable connectors, as well as fretting corrosion of the connectors. This high insertion force requires larger and bulkier connectors to be manufactured, thereby increasing the size of electronic components. The high insertion force also leads to high rates of breakage when assembling such components and thus, limits the number of connectors that can be practically used in a module.

Thus, U.S. Pat. Nos. 5,028,492 and 5,141,702 are directed to methods and compositions for preparing a composite coating having a ductile metal matrix selected from tin, lead, tin/lead alloys, and tin/indium alloys and tin/silver alloys having at least 90 percent tin, and a uniformly dispersed polymer component dispersed throughout the metal matrix in an effort to reduce frictional force when inserting an insertion component into a socket. A preferred coating contains 0.5 weight percent polytetrafluoroethylene in a tin matrix. These compositions are placed on a connector in bulk form, as a coating, or by electroless or electrolytic plating.

While somewhat useful, the distribution of the polymer component throughout the metal matrix results in reduced electrical characteristics with only a minimal gain in friction reduction and lubricity. Also, the use of a friction reducing component throughout the ductile metal matrix facilitates insertion of connectors but disadvantageously results in facilitation of removal as well. Thus, what is needed are components having both increased friction reduction for insertion, a higher friction to maintain the connection, and enhanced electrical properties.

SUMMARY OF THE INVENTION

The present invention resolves this need by providing electroplated deposits which have an initially reduced coefficient of friction to provide a reduced insertion force when assembling electronic connectors. After insertion and minimal wear, the coefficient of friction of such electrodeposits will advantageously increase to permit the connector to remain connected. This advantageously allows a good electrical connection to be made and permits further miniaturization of electronic components. In addition, the barrier layer and reduced-friction electrodeposit minimize fretting corrosion of separable connectors.

These advantages are achieved by providing a composite article having an electrically conductive substrate and a surface layer deposited over at least a portion of the substrate and comprising tin, lead, silver or an alloy thereof and a plurality of co-deposited polymeric particles having a diameter of about 0.1 to 0.45 $\mu$m dispersed throughout, wherein the surface layer has a thickness sufficient to provide an initial, relatively low coefficient of friction to the deposit, that is capable of being removed to expose portions of the article having a relatively higher coefficient of friction.

In another embodiment, the article further has at least one intermediate layer interposed between at least a portion of the substrate and the surface layer. In a preferred embodiment, the intermediate layer of the article is a conductive metal of tin, lead, silver, or an alloy thereof deposited directly on the substrate. The conductive metal layer preferably has a thickness of about 1 to 8 $\mu$m.

In yet another embodiment, one intermediate layer is a barrier layer different from that of the substrate and the surface layer, wherein the barrier layer has a thickness sufficient to at least reduce ion migration between the substrate and the surface layer. In a preferred embodiment, the barrier layer is nickel, cobalt, silver, iron, or alloys thereof, and the layer is present at a total thickness of between about 0.5 and 10 $\mu$m. In another preferred embodiment, the barrier layer is deposited directly on the substrate and an intermediate layer is deposited over the barrier layer. The intermediate layer may have a thickness of between about 0.5 and 8 $\mu$m.

In one embodiment, the polymeric particles of the surface layer are fluorocarbon particles present in an amount of at least about 5 weight percent, to reduce the coefficient of friction of the deposit to between about 0.02 to 0.45 while maintaining the contact resistance below about 10 milliohms over at least about 4,000 cycles.

In another embodiment, the invention relates to a composite article having an electrically conductive substrate and one of the layer constructions described above.

The invention also relates to a method for reducing the force necessary for assembling separable electronic components by providing mating surfaces to the components with the surface layer described above, which layer is deposited over at least a portion of the components. This method may include interposing at least one intermediate layer between at least a portion of the component and the surface layer. This intermediate layer may be a conductive metal deposited directly on the substrate, such as tin, lead, silver, or an alloy thereof having a thickness of about 1 to 8 $\mu$m. Alternatively, the intermediate layer may be a barrier layer which is different from that of the substrate and the surface layer, wherein the barrier layer has a thickness sufficient to at least reduce ion migration between the substrate and the surface layer. This barrier layer is generally selected to be nickel, cobalt, silver, iron, or an alloy thereof, and is present at a total thickness of between about 0.5 and 10 $\mu$m.

If desired, a barrier layer may be deposited directly on the substrate and an intermediate layer over the barrier layer. In all of these methods, the surface layer is advantageously provided by plating using a solution that contains an alkane sulfonic acid or sulfuric acid.

The invention also relates to a solution for plating one of the reduced friction tin, lead, or tin-lead co-deposits described above. This solution includes an acid component of sulfuric acid, sulfonic acid, and sulfonate, in an amount sufficient to impart a pH below about 2 to the solution, at least one of a solution soluble tin compound or solution soluble lead compound in an amount sufficient to deposit tin or lead metal, a substantially non-foaming, non-ionic surfactant in an amount sufficient to assist in depositing a smooth, adherent, uniform deposit, and fluorocarbon particles having a diameter of about 0.1 $\mu$m to about 0.45 $\mu$m and being present in an amount sufficient to co-deposit with the tin or lead metal to form a deposit having a coefficient of friction which is lower than deposits that do not contain fluorocarbon particles.

In a preferred embodiment, the acid component is methane sulfonic acid, ethane sulfonic acid, or propane sulfonic acid. In another embodiment, the solution further includes an antioxidant in an amount sufficient to reduce the formation of metal oxide sludge. In a preferred embodiment, the fluorocarbon particles are about 0.2 $\mu$m to 0.3 $\mu$m in diameter and are present in about 10 to 50 weight percent of the solution. In a more preferred embodiment, the fluorocarbon particles comprise polytetrafluoroethylene and are present in an amount sufficient to reduce the coefficient of friction of the deposit to about 0.02 to 0.8.

DETAILED DESCRIPTION OF THE INVENTION

Figure 1:
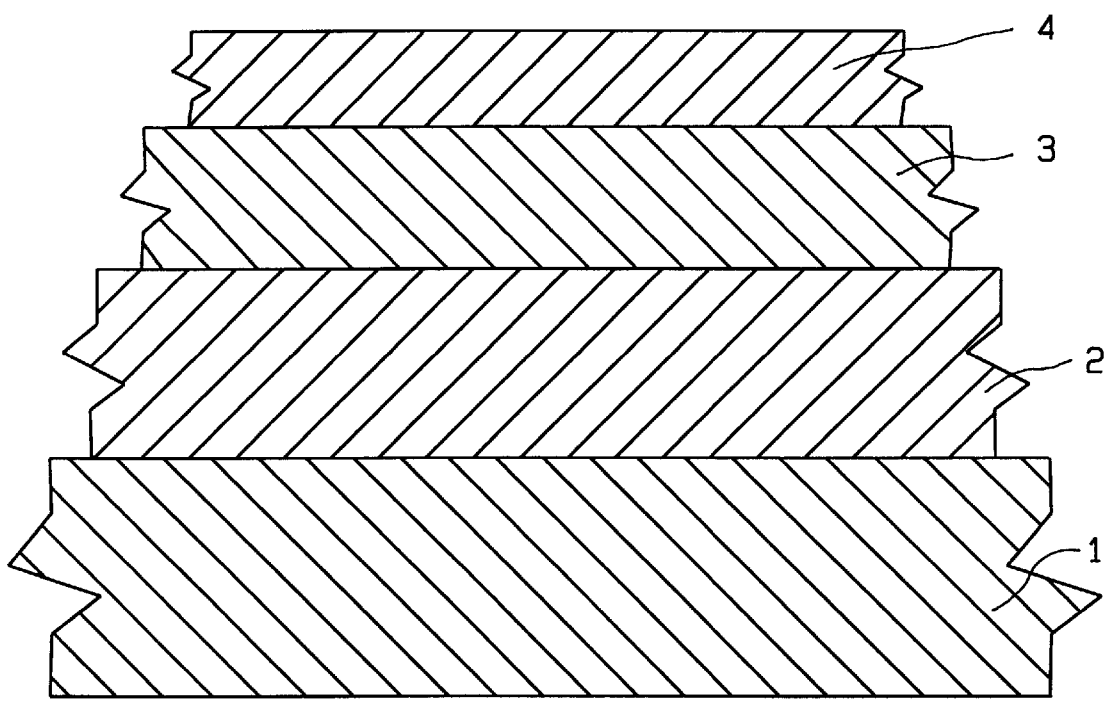
FIG. 1 is an illustration of a construction of the composite article according to the invention.

The present invention includes a plating bath, as well as a plating method, for providing deposits of tin, lead, silver and their alloys with a reduced coefficient of friction as the surface layer of a composite article, generally for use in electronic applications. Other benefits of the present invention include reduction in the insertion force required when attaching electronic connectors and reduction in fretting corrosion of the separable connectors, with the subsequent capability of an increase in the coefficient of friction that advantageously limits unwanted removal of the electronic connectors.

The present invention advantageously reduces the coefficient of friction below that of conventional electrodeposits for insertion into electrical components by providing a ductile metal matrix deposit surface layer, or a multi-layer metal matrix where the surface layer forms the topmost layer of the metal matrix. The surface layer is deposited over at least a portion of the substrate and includes tin, lead, silver or an alloy thereof and a plurality of co-deposited polymeric particles having a diameter of about 0.1 to 0.45 μm dispersed throughout, wherein the surface layer has a thickness sufficient to provide an initial, relatively low coefficient of friction to the deposit, but is capable of being removed to expose portions of the article having a relatively higher coefficient of friction.

In another embodiment of the invention, at least one intermediate layer is interposed between the substrate and the surface layer. Such a composite article is typically formed by depositing one or more intermediate layers upon at least a portion of the substrate, and preferably all of the surface of the substrate to be covered, and then depositing the surface layer upon at least a portion of the topmost intermediate layer, preferably upon the whole surface of the intermediate layer. This intermediate layer may be a barrier layer of a metal that prevents ion migration between the substrate and other intermediate or surface layers is deposited. The barrier may be deposited as any intermediate layer of the multi-layer ductile metal matrix, but it is preferably the deposited directly on the substrate. Examples of soft, ductile metals suitable for the barrier layer include, but are not limited to: nickel, cobalt, silver, iron, or alloys or mixtures thereof. For example, stainless steel, and other nickel-iron alloys that contain chromium or cobalt, can be used.

The barrier layer deposition may be accomplished by conventional methods known to those of ordinary skill in the art. For example, the barrier layer may be plated onto the substrate or other intermediate layer by an immersion method known as hot tin dipping, followed by the application of air knives to level the coating and create a uniform barrier layer deposit. Electroless or electroplating of the deposit may also be utilized, if desired. Although one barrier layer is often suitable, multiple barrier layers can be used, if desired for any particular application.

Each barrier layer should be of sufficient thickness to prevent ion migration between the substrate and intermediate or surface layers. The minimum useful thickness is at least 0.5 μm and is preferably greater than about 1 μm (~40μ in.), while the maximum thickness of each barrier layer is dependent upon the ductile metal system being used. For example, a silver barrier layer could have a thickness up to about 8 μm (~320 μm in.). As the thickness of a barrier layer increases, however, the coefficient of friction typically increases as well. The barrier layer should also have a maximum thickness that avoids imparting significant frictional properties to the substrate without being so thick as to become too soft or to have a largely increased coefficient of friction itself. The combination of barrier layers, or barrier and intermediate layers, may be reasonably thicker than any particular intermediate layer, so long as the ultimate coefficient of friction is sufficiently below that of the substrate to meet the purposes of the invention subsequent to deposition of the polymeric particle co-deposited surface layer. Examples of maximum layer thicknesses include: a tin layer with a thickness of up to about 6 μm (~240μ in.), and a nickel layer with a thickness up to about 3 μm (~120μ). Thus, a tin intermediate layer should be about 1 to 6 μm, preferably about 2 to 5 μm, and most preferably about 3 to 4 μm thick, while a nickel layer would be about 1 to 3 μm, and preferably about 1.5 to 2.5 μm thick.

Combinations of intermediate layers can be used. A first layer, deposited on the substrate, would generally be a barrier layer of a material that reduces the tendency of the surface layer to form intermetallic compounds. When the surface layer includes tin and the substrate is copper, a first barrier layer of nickel, for example, is preferred to avoid formation of intermetallic compounds. The first barrier layer should be deposited at a thickness of between about 0.5 to 10 μm, preferably about 1 to 4 μm, and more preferably about 1.5 to 3 μm.

A second intermediate layer or additional intermediate layers can be deposited upon the first layer, which may be a barrier layer or simply a first intermediate layer, when necessary. The second layer is one that typically has the desired electrical or other characteristics of the deposit without the polymeric particles. This allows a thinner surface layer to be used, if desired, so that after a number of cycles the deposit takes on the characteristics of the second intermediate layer. This layer is typically a tin or tin alloy, although any of the ductile metals disclosed herein is suitable for use as an intermediate layer. This layer may be present at a similar thickness to the first intermediate layer.

The substrate initially plated with the barrier layer and/or other intermediate layers is then provided with the surface layer. The most convenient way to do this is by electroplating. The barrier layer coated substrate is immersed in a plating bath prepared from alkane sulfonic acid, alkane sulfuric acid, or an alkane sulfonate solution which contains tin, a non-ionic surfactant, an antioxidant, a polymeric particle suspension, and, if desired, lead. The alkane sulfonic or sulfuric acid or alkane sulfonate typically includes any of the lower alkanes, but the alkane is preferably methane, ethane, or propane sulfonic acid, with methane sulfonic acid being most preferred due to cost and availability considerations. The solution is highly acidic, having a pH of less than about 2, and more preferably less than about 1.

Although the intermediate layers may be plated with the methods discussed below, these methods primarily describe the surface layer formation. The tin and lead metals can be added to the acid in the form of a metal or alloy which will react with the acid to form a metal sulfonate salt. Also, tin and lead can be added to the basis solution of alkylsulfonic acid and water in the form of a solution soluble compound, such as a divalent metal salt. While any one of a wide variety of salts may be used, such as tin chloride, it is highly advantageous to add the metals to the solution in the form of metal sulfonate salts that have been previously prepared. This feature is well known in the electroplating art. Also, one of ordinary skill in the art would know the amount of metal salt(s) to add to obtain the resultant deposit of tin, lead, or tin-lead alloy.

The use of tin over other metals in plating the surface layer is preferred due to its low cost, corrosion inhibition properties, low contact resistance, and conventional use in solder materials. For example, nickel has poor (i.e., high) contact resistance and copper corrodes easily. Tin used in solder materials alone, however, may produce whisker formations after lengthy time periods and under certain temperature and humidity conditions. Thus, it is most advantageous to use lead in a tin-lead alloy, as this inhibits the whisker formation that occurs in tin alone.

The preferred alkane sulfonic acid, or other suitable acid, of the basis solution advantageously represents about 2 to 40 percent, more preferably about 5 to 35 percent, and most preferably about 8 to 30 percent by volume. The tin as tin methanesulfonate is typically added in an amount between about 1 to 150 g/l, more preferably about 30 to 130 g/l, most preferably about 60 to 110 g/l. The lead as lead methanesulfonate is added in an amount between about 0 to 100 g/l, more preferably about 3 to 80 g/l, and most preferably about 6 to 60 g/l. Depending upon the desired electrodeposit, tin alone, lead alone, or combinations thereof may be used.

The preferred surfactant, or wetting agent, preferably is a non-ionic one that does not foam or which generates very low amounts of foam. A mixture of surfactants can also be used, as long as they have no charge. Surfactants having a charge, such as cationic surfactants, are believed to inhibit uniform dispersion of the PTFE particles throughout the deposit, thereby imparting poor electrical properties to the plated article. For example, any of the non-ionic surfactants described in U.S. Pat. Nos. 4,880,507 and 4,994,155 can be used, the disclosures of which are expressly incorporated herein by reference thereto. The surfactant is present in an amount between about 0.3 to 25 g/l, more preferably about 0.4 to 16 g/l, and most preferably about 0.5 to 10 g/l. Certain surfactants, such as MASIL® SF19 and MACOL® 300 surfactants are preferred, and these may be used alone or in combination. These non-ionic surfactants are a silicone surfactant and a polyalkaline glycol surfactant, respectively. Both surfactants are available from PPG in Pittsburgh, Pa. This combination of surfactants results in a smoother, more adherent deposit with lower friction than the standard surfactants, and facilitates plating of a very thin surface layer of the multi-layer ductile metal matrix.

A variety of common antioxidants may be used to prevent metal sludge formation, but the hydroxy-phenyl compounds are preferred. Specifically advantageous compounds include pyrocatechol, hydroquinone, resorcinol, phloroglucinol, pyrogallol, 3-amino phenol, hydroquinone sulfuric acid ester, catechol, and the like, as disclosed in U.S. Pat. Nos. 5,066,376 and 5,094,726, which are incorporated herein by reference thereto for the purpose of suitable antioxidants. A di-hydroxy substituted benzene, such as hydroquinone, resorcinol, or catechol is more preferably used. The most preferred antioxidant is hydroquinone. The antioxidant is added in an amount between about 0.2 to 2 g/l, more preferably about 0.5 to 1.8 g/l, and most preferably about 0.8 to 1.6 g/l. These antioxidants assist in reducing the formation of tetravalent tin, and the resulting tin oxide sludge that retards the oxidation of tin, by combining with the metal sulfonic acid. Reduction in tetravalent tin or sludge typically enhances the plating speed, as long as the antioxidants are not present in so great an amount as to precipitate or adversely affect solubility of other plating bath components.

The electroplating bath also contains polymeric particles for co-deposition with the metal or metals. Although any polymeric resin particles may be used, it is preferred to use fluorocarbon particles due to their low friction and lubricity properties. In particular, PTFE particulate resins are more preferred due to their ready availability and relatively low cost compared to other fluorocarbon resins. Although particle sizes up to 1 $\mu$m are suitable for use in the present invention, the particles should have a diameter of about 0.1 $\mu$m to 0.45 $\mu$m, preferably about 0.15 $\mu$m to 0.35 $\mu$m, and more preferably about 0.2 $\mu$m to 0.3 $\mu$m.

In a more preferred embodiment, TEFLON® TE3667-N particles in a 60% aqueous solution are used. This solution is added in an amount of between about 1 to 50 volume percent, more preferably about 2 to 35 volume percent, and most preferably about 3 to 20 volume percent. Thus, the amount of particles is typically between about 0.5 to 30 percent by volume of the solution when TEFLON® TE3667-N is used. Other fluorocarbon particles of similar particle sizes and amounts may be used, if desired. For convenience, the term "PTFE" is generically used herein to refer to any of these suitable polymeric particles.

The plating solution of the present invention may be prepared according to the following method. Each ingredient, including the alkane sulfonic acid, tin acid salt, lead acid salt, surfactant mixture, antioxidant, and PTFE particles, are simply added to an aqueous solution in any order desired. In a preferred embodiment, the plating bath is prepared by placing tin, lead, or tin-lead alloy sulfonic acid salt in an excess of the alkyl sulfonic acid, adjusting the acid content to the required pH, adding PTFE particles, adding surfactant and antioxidant, removing any undissolved matter by filtration, and then diluting with water to the final desired volume. Although not essential to the electroplating process, agitation is preferred to uniformly distribute the PTFE particles in the solution, as well as to increase the electroplating speed.

The solution is plated using a cathodic current density of about 5 to 200 ASF (amps/ft$^2$), preferably about 15 to 180 ASF, and more preferably about 25 to 150 ASF, to produce a smooth adherent deposit. Any suitable substrate of any suitable thickness for electrical components can be used, but typically these are metals such as copper or iron containing alloys, such as copper, brass, bronze, steel, stainless steel, and the like. The substrate metals are generally harder than the multi-layer ductile metal matrix deposited thereon. The plating of the surface layer should occur at about 20° C. to 40° C., more preferably about 22° C. to 35° C., and most preferably about 24° C. to 30° C. Unlike the barrier layer, or other intermediate layers, a very thin PTFE co-deposited surface layer is desired. Although the surface layer may have a thickness of about 0.5 to 8 $\mu$m, preferably 0.5 to 1.5 $\mu$m, and more preferably about 0.8 to 1.3 $\mu$m is desired. This thin layer advantageously reduces friction for insertion of components, but ordinary use of the electrical component will eventually wear away the low friction surface layer to increase friction and reduce the possibility of contact failure due to slippage of the component and connector. One of ordinary skill in the art can operate within the above conditions to achieve the desired deposit thickness without undue experimentation.

With the use of multiple intermediate layers, the thickness of the surface layer only needs to be about 0.5 to 3 $\mu$m, and more preferably about 0.5 to 1.5 $\mu$m. The surface layer may still be as thick as about 0.5 to 8 $\mu$m, of course. This thicker surface with a lower coefficient of friction may be desirable in certain electronic applications where a co-deposited component may be frequently removed and reconnected and it is not desired that the surface layer wear thin or through to an intermediate layer.

FIG. 1 depicts the construction of a composite article according to the present invention. A substrate 1 of an electrically conductive metal such as copper is provided. Over a portion of the substrate 1, intermediate layers 2 and 3 are deposited. These intermediate layers 2 and 3 may be two barrier layers, a barrier layer and an intermediate layer of the same base material as the surface layer 4 or the other intermediate layer, or simply two intermediate layers having desired electrical characteristics that will reduce, or preferably prevent, ion migration. In a preferred embodiment, intermediate layer 2 is a barrier layer of nickel to prevent ion migration between the substrate 1 and the intermediate layer 3, while intermediate layer 3 includes a material such as silver which has the electrical properties ultimately desired should the surface layer 4 wear through. The surface layer 4 is deposited on top of at least a portion of the intermediate layers to impart a reduced coefficient of friction to reduce insertion force without substantially increasing contact resistance. During usage of the composite article, such as an electronic component, the surface layer is capable of rapidly wearing through, which results in the friction increasing to that of the intermediate layer 3 to hinder slippage of crucial electronic connections.

Several basic constructions of the composite article are also envisioned as follows, all of which involve various layers on a substrate: (1) a surface layer 4 of PTFE/silver co-deposited directly on the substrate 1; (2) a surface layer 4 of PTFE/tin-lead co-deposited directly on the substrate 1; (3) one of the above surface layers 4 deposited on a barrier layer 3 of nickel, which covers at least a portion of the substrate 1; (4) one of the above surface layers 4 deposited on a barrier layer 3, which is deposited on one or more intermediate layers 2, which are deposited on the substrate 1; (5) one of the above surface layers 4 deposited on one or more intermediate layers 3, which are themselves deposited on a barrier layer 2 deposited on the substrate 1.

The surface layer deposit, or coating, has a low contact resistance as measured per MIL-STD-1344A Method 3002.1, even after 4,000 hours at 115° C. and 50 g Normal force. The contact resistance of such deposits is typically less than about 15 milliohms, preferably less than about 10 milliohms, and more preferably less than about 3.5 milliohms. The low contact resistance of the surface layer remains below these values over at least about 500 cycles, preferably over at least about 1,500 cycles, more preferably over at least about 4,000 cycles, and most preferably over at least about 10,000 cycles. The deposit is ductile, resists fracturing and breaking during a 90 degree bend test, and, as seen in the Examples below, has a coefficient of friction reduced below 0.55, typically to about 0.02 to 0.45, preferably to about 0.04 to 0.35, and more preferably about 0.06 to 0.25 using a 400 g load. The deposit is solderable per MIL-STD-883D Method 2003.7. Furthermore, the deposit has increased wear resistance compared to the prior art deposits, as measured by a decrease in wear index and increase in the number of cycles to failure. Additionally, the fretting corrosion was reduced in the present invention.

These properties are achieved by including at least about 5 weight percent, preferably about 10 to 50 weight percent, and more preferably about 20 to 25 weight percent, of the PTFE particles in the deposit. Remarkably, the appearance of the deposit when tin or tin-lead are used is typically the same as that of a tin or tin-lead deposit that does not include the fluorocarbon particles. However, the deposit has a more slippery feel than that of a non-fluorocarbon particle containing deposit.

The above improved characteristics advantageously provide the invention with increased life and increased reliability for electrical connectors, reduced factory defects during connector assembly as a result of the reduced insertion force, and reduced crimp formation defects. The invention also permits an eventual increase in friction subsequent to insertion of the component in a connector, which impedes the component having a deposit from slipping out of the connector during use and preventing undesired contact failures. The connectors produced by the invention may be used for the same applications and in the same manner as conventionally electroplated tin, lead, and tin-lead alloys.

It will be understood that generally recognized good engineering and chemistry practice will be observed during the selection of proper components for the solution and plating process to prepare the composite articles without departing from the present invention.

EXAMPLES

Examples 1–3

Three plating formulations were prepared according to the method disclosed above in the amounts shown in Table 1.

The resulting deposits were then subjected to friction and wear testing, the results of which are shown in Table 1.

TABLE 1

Specific Compositions and Conditions of Plating

| COMPONENTS | EXAMPLE 1 | EXAMPLE 2 | EXAMPLE 3 |
|---|---|---|---|
| 70% Methanesulfonic Acid | 10% by volume | 10% by volume | 10% by volume |
| Tin as Tin Methanesulfonate | 105 g/l | 105 g/l | 105 g/l |
| Lead as Lead Methanesulfonate | 7.5 g/l | 7.5 g/l | 7.5 g/l |
| Hydroquinone | 0.5 g/l | 0.5 g/l | 0.5 g/l |
| MASIL ® SF19 | 1 g/l | 1 g/l | 1 g/l |
| MACOL ® 300 | 0.5 g/l | 0.5 g/l | 0.5 g/l |
| TEFLON ® TE3667-N | None | 45 g/l | 90 g/l |
| Temperature (°C.) | 25 | 28 | 30 |
| Agitation (cm/s) (Liquid flow) | 150 | 150 | 150 |
| Current Density (ASF) | 50 | 50 | 50 |
| Deposit Thickness (µ inches) | 150 | 150 | 150 |
| Coeff. of Friction vs. Load (100 grams Normal Force) @ 5 cycles of 1 cm track, 0.5 cm/sec | 0.75 | 0.07 | 0.06 |
| Coeff. of Friction vs. Load (400 grams Normal Force) @ 5 cycles of 1 cm track, 0.5 cm/sec | 0.37 | Not Tested | 0.06 |
| Cycles to Failure (400 grams Normal Force) on 1 cm track, 0.5 cm/sec | 30 | Not Tested | 155 |

[1]Surfactant tradename available from PPG of Pittsburgh, PA.
[2]Surfactant tradename available from PPG of Pittsburgh, PA.
[3]Fluoropolymer resin from DuPont Corp. of Wilmington, DE.

Examples 1–3 illustrate the performance of electroplated PTFE co-deposits with tin, lead, silver, or alloys thereof directly on electrical connectors. It is seen that by increasing the plating temperature and the amount of PTFE present in solution, the resulting coefficient of friction is greatly reduced and the number of cycles to failure (i.e., wear resistance) is greatly increased. The smallest coefficient of friction and greatest number of cycles to failure are desired for optimum performance when PTFE/tin-lead is electrodeposited directly on the substrates.

On the other hand, a relatively low number of cycles to wear the deposit thin are desired in the present invention. After a connector is coated in the solution, the contact system is desirably locked together. This is accomplished by increasing the friction just reduced by adding a multi-layer metal matrix to the substrate. Friction is increased by rapid wear and thinning of the surface layer, which contains the fluorocarbon particle co-deposit. Wear occurs primarily by two avenues: (1) micromotion caused by the jostling of the components during use of the application, and (2) temperature excursions, or cycling, possibly due to use of the application or environmental considerations. Although a wide variety of wear may be required and may occur before the friction increases enough to lock in the component, it is preferable that about 10 to 20 cycles of temperature cycling be sufficient for this "lock in" to occur. This is determined primarily by the thin nature of the surface layer of the metal matrix, which substantially wears through to the topmost intermediate layer having higher friction properties than the surface layer.

Examples 4–5

The contact resistance of a plated substrate according to the present invention was tested by preparing two samples using the plating formulation of Example 3 above. Example 4 tested the contact resistance of a 120 μm inch plating layer according to the present invention on a 425 Brass substrate. Example 5 tested the contact resistance of 120μ inch plating layer according to the present invention on a 80μ inch nickel layer on a 425 Brass substrate.

TABLE 2

Low-Signal Level Contact Resistance with Standard Deviation v. Thermal Aging Exposure Data

| Thermal Exposure at 115° C. (hrs) | Ex. 4: 120μ in. PTFE-tin plating/425 Brass (milliohms) | Ex. 5: 120μ in. PTFE-tin plating/80μ in. nickel/425 Brass (milliohms) |
| --- | --- | --- |
| 0 | 1.97 ± 0.42 | 2.23 ± 0.68 |
| 1,000 | 1.82 ± 0.62 | 2.54 ± 0.87 |
| 4,000 | 1.16 ± 0.19 | 1.87 ± 0.48 |

The results show that the PTFE-containing deposits unexpectedly have good contact resistance, even though the deposit contains PTFE, which is considered to be a dielectric material. Example 5 included the use of an intermediate layer interposed between the substrate and the surface layer.

Although preferred embodiments of the invention have been described in the foregoing Detailed Description of the Invention, it will be understood that the invention is not limited to the embodiments disclosed but is capable of numerous modifications without departing from the spirit and scope of the present invention. It will be understood that the chemical details may be slightly different or modified by one of ordinary skill in the art without departing from the methods and solutions disclosed and taught by the present invention.

What is claimed is:

1. A method for reducing the force necessary for assembling separable electronic components which comprises providing mating surfaces of the components with a surface layer electrodeposited over at least a portion of the components, said surface layer comprising tin, lead, silver or an alloy thereof and at least about 5 weight percent of co-deposited polymeric particles having a diameter of about 0.1 to 0.45 μm dispersed throughout, wherein the surface layer has a thickness sufficient to provide an initial, relatively lower coefficient of friction to the electrodeposit, but which, after being removed during the assembling of the components or thereafter to expose portions of the components, has a relatively higher coefficient of friction.

2. The method of claim 1, further comprising interposing at least one intermediate layer between at least a portion of the component and the surface layer.

3. The method of claim 2, wherein the at least one intermediate layer comprises a conductive metal deposited directly on the substrate.

4. The method of claim 3, wherein the conductive metal comprises tin, lead, silver, or an alloy thereof having a thickness of about 1 to 8 μm.

5. The method of claim 2, wherein the at least one intermediate layer is a barrier layer different from that of the substrate and the surface layer, wherein the barrier layer has a thickness sufficient to at least reduce ion migration between the substrate and the surface layer.

6. The method of claim 5, wherein the barrier layer comprises nickel, cobalt, silver, iron, or alloys hereof, and is present at a total thickness of between about 0.5 and 10 μm.

7. The method of claim 5, comprising a barrier layer deposited directly on the substrate and the at least one intermediate layer over the barrier layer.

8. The method of claim 7, wherein the barrier layer comprises a metal or alloy having a thickness of about 0.5 to 10 μm.

9. The method of claim 1, wherein the polymeric particles are selected as fluorocarbon particles, and providing the fluorocarbon particles in the surface layer in an amount of about 10 to 50 weight percent to reduce the coefficient of friction of the electrodeposit to between about 0.02 to 0.45.

10. The method of claim 1, wherein the surface layer is tin, lead or an alloy thereof and is provided by contacting the components with a solution consisting essentially of:

an acidic component selected from the group consisting of sulfuric acid, sulfonic acid, and sulfonate, in an amount sufficient to impart a pH below about 2 to the solution;

at least one of a solution soluble tin compound or solution soluble lead compound in an amount sufficient to deposit tin or lead metal;

a substantially non-foaming, non-ionic surfactant in an amount sufficient to assist in depositing a smooth, adherent, uniform deposit; and fluorocarbon particles having a diameter of about 0.1 μm to about 0.45 μm and being present in an amount sufficient to co-deposit with the tin or lead metal to form a deposit having a coefficient of friction smaller than deposits that do not contain the fluorocarbon particles.

11. The method of claim 10, wherein the acidic component of the solution is methane sulfonic acid, ethane sulfonic acid, or propane sulfonic acid.

12. The method of claim 10, wherein the solution further comprises an antioxidant in an amount sufficient to reduce the formation of metal oxide sludge.

13. The method of claim 10, wherein the fluorocarbon particles in the solution are about 0.2 μm to 0.3 μm in diameter and are present in about 10 to 50 weight percent of the solution.

14. The method of claim 10, wherein the fluorocarbon particles in the solution comprise polytetrafluoroethylene and are present in an amount sufficient to initially reduce the coefficient of friction of the surface layer to about 0.02 to 0.8.

* * * * *

UNITED STATES PATENT AND TRADEMARK OFFICE
CERTIFICATE OF CORRECTION

PATENT NO. : 5,853,557

DATED : December 29, 1998

INVENTOR(S) : Therese R. Souza et al.

It is certified that errors appear in the above-identified patent and that said Letters Patent is hereby corrected as shown below:

ON THE TITLE PAGE ITEM,[75] Inventors: change "Theresa" to --Therese--.

Column 12, line 7 (claim 6, line 2): change "hereof" to --thereof--.

Signed and Sealed this

Eighteenth Day of May, 1999

Attest:

Q. TODD DICKINSON

*Attesting Officer*      *Acting Commissioner of Patents and Trademarks*